US010072756B2

(12) United States Patent
Kennedy et al.

(10) Patent No.: US 10,072,756 B2
(45) Date of Patent: Sep. 11, 2018

(54) SLIDING ELEMENT, IN PARTICULAR PISTON RING

(71) Applicant: FEDERAL-MOGUL BURSCHEID GMBH, Burscheid (DE)

(72) Inventors: Marcus Kennedy, Dusseldorf (DE); Michael Zinnabold, Burscheid (DE); Peter Esser, Kurten (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 0 days.

(21) Appl. No.: 15/111,272

(22) PCT Filed: Dec. 8, 2014

(86) PCT No.: PCT/EP2014/076866
§ 371 (c)(1),
(2) Date: Jul. 13, 2016

(87) PCT Pub. No.: WO2015/106884
PCT Pub. Date: Jul. 23, 2015

(65) Prior Publication Data
US 2016/0341312 A1 Nov. 24, 2016

(30) Foreign Application Priority Data
Jan. 15, 2014 (DE) .................. 10 2014 200 607

(51) Int. Cl.
| *F16J 9/26* | (2006.01) |
| *C23C 28/00* | (2006.01) |
| *C23C 30/00* | (2006.01) |
| *C23C 14/02* | (2006.01) |
| *C23C 14/06* | (2006.01) |
| *C23C 16/02* | (2006.01) |
| *C23C 16/32* | (2006.01) |

(52) U.S. Cl.
CPC .............. *F16J 9/26* (2013.01); *C23C 14/025* (2013.01); *C23C 14/0635* (2013.01); *C23C 16/0281* (2013.01); *C23C 16/32* (2013.01); *C23C 28/321* (2013.01); *C23C 28/322* (2013.01); *C23C 28/341* (2013.01); *C23C 28/343* (2013.01); *C23C 28/347* (2013.01); *C23C 30/00* (2013.01)

(58) Field of Classification Search
CPC ......... F16J 9/00; F16J 9/12; F16J 9/26; C23C 28/30; C23C 28/32; C23C 28/321; C23C 28/322
See application file for complete search history.

(56) References Cited

U.S. PATENT DOCUMENTS

| 5,582,414 A | 12/1996 | Miyazaki et al. | |
| 6,066,399 A | 5/2000 | Hirano et al. | |
| 8,206,035 B2* | 6/2012 | Martin ................ | C10M 129/00 384/13 |
| 9,086,148 B2 | 7/2015 | Kennedy | |
| 9,476,454 B2* | 10/2016 | Adam ................... | F16C 33/201 |
| 2004/0261614 A1 | 12/2004 | Hamada et al. | |
| 2005/0188942 A1 | 9/2005 | Hamada et al. | |
| 2007/0224349 A1 | 9/2007 | Hosenfeldt et al. | |
| 2011/0268944 A1* | 11/2011 | Adam ...................... | F16C 9/00 428/216 |
| 2012/0187435 A1 | 7/2012 | Gy et al. | |
| 2012/0248711 A1 | 10/2012 | Iwashita et al. | |
| 2013/0042845 A1 | 2/2013 | Kennedy et al. | |
| 2013/0084031 A1 | 4/2013 | Kennedy et al. | |
| 2013/0140776 A1* | 6/2013 | Kennedy .............. | C23C 14/025 277/442 |
| 2013/0252860 A1* | 9/2013 | Komori ................ | C10M 141/10 508/108 |
| 2015/0122211 A1* | 5/2015 | Maier ................. | C23C 14/0641 123/193.4 |
| 2015/0240347 A1* | 8/2015 | Lehnert ................... | C23C 14/06 428/140 |
| 2015/0362071 A1* | 12/2015 | Ivanov ................... | C23C 28/32 277/442 |

FOREIGN PATENT DOCUMENTS

| CN | 1573064 A | 2/2005 |
| CN | 102666925 A | 9/2012 |
| CN | 102705102 A | 10/2012 |
| CN | 103032566 A | 4/2013 |
| DE | 4419713 A1 | 12/1994 |
| DE | 102004041235 A1 | 3/2006 |
| DE | 102008022039 A1 | 11/2009 |
| DE | 102011003254 A1 | 8/2012 |
| EP | 0724023 B1 | 7/2001 |
| WO | 2012100847 A1 | 8/2012 |

OTHER PUBLICATIONS

International Search Report, dated Feb. 25, 2015 (PCT/EP2014/076866).
Wos P et al., "Effect of Initial Cylinder Liner Honing Surface Roughness on Aircraft Piston Engine Performances", Tribology Letters, vol. 41, No. 3, Jan. 6, 2011 (Jan. 6, 2011), pp. 555-567, XP019883784, Kluwer Academic Publishers-Plenum Publishers, table 2.
Kuzinovski M et al., "Effect of sampling parameters upon change of hybrid parameters values of the roughness profile", Journal of Production Engineering, vol. 12, No. 1, Dec. 2009 (Dec. 2009), pp. 23-28, XP055167058, Faculty of Technical Sciences—Department for Production Engineering, Novi Sad.
Wos P et al; "Effect of Initial Cylinder Liner Honing Surface Roughness on Aircraft Piston Engine Performances", Tribology Letters, Bd. 41, Nr. 3, Jan. 6, 2011, Seiten 555-567, XPo19883784, Kluwer Academic Publishers-Plenum Publishers [NL] ISSN: 1573-2711, DOI: 10.1007/S11249-010-9733-Y Tabelle 2.
Kuzinovski M et al; "Effect of Sampling Parameters Upon Change of Hybrid Parameters Values of the Roughness Profile", Journal of Production Engineering, Bd. 12, Nr. 1, Dec. 2009, Seiten 23-28, XP055167058, Faculty of Technical Sciences—Department fro Production Engineering, Novi Sad [RS] ISSN; 1821-4932.

* cited by examiner

*Primary Examiner* — Gilbert Y Lee
(74) *Attorney, Agent, or Firm* — Robert L. Stearns; Dickinson Wright, PLLC

(57) ABSTRACT

The invention relates to a sliding element, in particular a piston ring, having a carbon-based coating and at least in sections, a surface roughness ($R_{Aq}$) according to DIN EN ISO 4287 of 0.05, preferably 0.08, to 0.11, preferably to 0.1 μm.

18 Claims, No Drawings

SLIDING ELEMENT, IN PARTICULAR PISTON RING

BACKGROUND

1. Technical Field

The invention relates to a sliding element, in particular a piston ring.

For sliding elements in general and piston rings in particular, it is an essential criterion to what extent friction losses occur during operation. In internal combustion engines in which piston rings are used, both the market and legislation require a reduction of fuel consumption and thus carbon dioxide emissions. Since piston rings are responsible for roughly one quarter of mechanical friction losses and thus for approximately 4% of fuel consumption, research is focusing extensively on measures to generally reduce these friction losses caused by piston rings and sliding elements.

2. Related Art

In prior art, as described for example in DE 44 19 713 A1, hard metal coatings are used which are usually produced by PVD methods. Secondly, amorphous DLC coatings are used which, however, can usually only be applied in a layer thickness of a few μm. Another challenge is to provide the extremely hard DLC coatings with a sufficiently low roughness to avoid damage to the cylinder running surfaces or cylinder liners as well as wear. Different TaC coating systems suitable for this purpose are known from DE 10 2008 022 039 A1 and from EP 0 724 023 A1.

SUMMARY OF THE INVENTION

In view of this background, the invention is based on the object of providing a sliding element and in particular a piston ring which is improved with regard to the combination of lowest possible wear and lowest possible friction also at the start of the sliding movement, in particular of the engine.

The sliding element, which is preferably a piston ring, has a running surface provided with a carbon-based coating and at least in sections a roughness RΔq according to DIN EN ISO 4287 of 0.05, preferably 0.08 to 0.11, preferably up to 0.1. Extensive tests have revealed that the comparatively low friction losses when using carbon-based coatings are due to the fact that, thermally and/or mechanically induced, sp3-hybridized carbon atoms are converted into sp2-hybridized carbon atoms. This results in a very thin and, compared to the DLC layer there below, softer top layer which causes a reduction in friction.

This desired conversion particularly benefits from the fact that the mean profile slope of the roughness profile is above, or at best equal to, the minimum value of 0.05. The RΔq value used for the invention is defined by said standard as being the root mean square of the profile slope, thus the mean square gradient of the filtered profile, relative to the mean line. A low value thus means a comparatively "flat" profile and a high value a comparatively "steep" profile. Tests have revealed that below an RΔq value of 0.05, the friction coefficient becomes larger than 0.035 which is in an undesired dimension. Therefore, with RΔq values larger than, or at best equal to, 0.05, very low friction coefficients can be ensured, which is explained by the fact, although the invention should not be limited thereto, that the profile slope is sufficiently steep to cause a large number of conversions from sp3- to sp2-hybridized carbon atoms and to thereby positively influence the friction coefficient in the desired manner.

At the same time it was found that with $RΔ_q$ values of 0.1 or more, and in particular of 0.11 or more, wear increases in an undesired manner, namely in the range of more than 3 μm. The explanation for this, to which the invention should not be restricted either, is that in a comparatively "steep" roughness profile slope the surface pressing is increased which promotes wear. The invention thus provides an advantageous balance between favorable wear values and low friction coefficients. With regard to the desired $RΔ_q$ values, it should be mentioned that they can be adjusted by suitable coating processes and in particular machining processes. The $RΔ_q$ values are ensured by a suitable combination of coating and smoothing processes. The coating process is a PA-CVD or PVD process. These processes allow a targeted adjustment of the mechanical properties necessary to achieve the required roughness values. The setting parameter is the energy of the deposited carbon ions. This energy can be affected by changes in the evaporator power, by magnetic fields as well as by the bias supply. The smoothing process is a superfinishing using defined diamond-containing smoothing tools, with the diamond morphology, the distribution of bonded diamonds as well as the tool itself being adapted in an appropriate manner.

The invention is primarily based on the aforementioned findings relating to the range for the $RΔ_q$ value, while it was found with regard to other roughness parameters that these are not suitable for restriction to specific ranges to achieve an advantageous balance between wear values and friction values. With regard to the aforementioned measurement values, it must be stated, as particularized below with reference to the table, that these values were determined under mixed friction conditions as are relevant during the actual operation of internal combustion engines. Here, the lubrication film thickness achieves essentially the total surface roughness of base body and counter body, thus for example of piston ring and cylinder liner, such that loads can be transferred to the running parameters as a result of the direct contact of the roughness peaks. In this situation, the friction conditions are influenced by the solid body contact, which requires as smooth as possible surfaces. Even the smallest unevenness can cause shear forces which damage in particular the carbon-based coating and can result in a detachment of the coating.

Since the sliding contact between, for example, a piston ring and a cylinder liner occurs in particular in the region of a convexity, thus a convexly curved running surface of the piston ring, it is preferred that the roughness according to the invention is formed at least in the region of such a convexity.

Moreover, it was found that the described $RΔ_q$ values should be present in an axial direction of the piston ring on 10 to 90%, preferably 25 to 75%, of the running surface.

The coating is preferably a carbon-based coating of the type TaC to be able to particularly well exploit the described effects.

For the layer thickness of the carbon-based coating, a range of 0.5, preferably 10 to 30, μm, has proven to be particularly advantageous. A further preferred layer thickness range is 0.5 to 10 μm.

This applies in the same manner to an sp3 amount, thus an amount that can be converted into an amount of sp2-hybridized carbon atoms of at least 40 at %.

During the tests, it could further be established that the consistent correlation between the $R\Delta_q$ values and wear as well as friction coefficients was found in particular for E-modulus values of 180 to 260 GPa and hardness values of 1600 to 2800 HV 0.02. Both parameters are measured according to the Oliver & Pharr method (O&P).

With regard to the sp3/sp2 ratio, 0.3 to 1.2 is preferred.

To ensure secure adhesion of the carbon-based coating on a substrate, a metal-containing adhesive layer including chromium and/or titanium between the carbon-based coating and the substrate is preferred.

A range of 0.05 μm to 1.0 μm has proved to be favorable for the thickness of the adhesive layer.

The described, favorable effects on both wear and friction coefficient could be ascertained in particular for an amount of carbon in the coating, which is more than 99% over the entire layer thickness.

Finally, the piston ring is preferably made of cast iron or steel.

DETAILED DESCRIPTION

Examples according to the invention in the form of real piston ring segments on a real, honed gray cast iron cylinder path segment in an oscillation-friction-wear measurement system were tested under mixed friction conditions at defined pressure and temperature conditions. The table below provides the respective μm values, designated with Rdq, together with the respective ring wear and friction coefficient. As is particularly evident from the overall evaluation, both ring wear and friction coefficient are only okay ("OK") in a range of 0.05 to 0.11 of the $R\Delta_q$ value. E-modulus and hardness were in the aforementioned ranges, for which a particularly consistent correlation between $R\Delta_q$ values and ring wear as well as friction coefficient could be found.

The invention claimed is:

1. A sliding element having at least one running surface provided with a carbon-based coating, and at least in sections a roughness RΔq of 0.05 to 0.1 when calculated according to DIN EN ISO 4287.

2. The sliding element according to claim 1, wherein the roughness RΔq of 0.05 to 0.1 is formed at least in the region of a convexity of the sliding element.

3. The sliding element according to claim 1, the roughness RΔq of 0.05 to 0.1 is formed in an axial direction over 10 to 90% of the running surface.

4. The sliding element according to claim 1, wherein the carbon-based coating is of the type TaC.

5. The sliding element according to claim 1, wherein the layer thickness of the coating is 0.5 to 30 μm.

6. The sliding element according to claim 1, wherein the carbon-based coating has an amount of sp3-hybridized carbon atoms of at least 40 at %.

7. The sliding element according to claim 1, wherein the carbon-based coating has an E-modulus of 180 to 260 GPa and/or a hardness of 1600 to 2800 HV 0.02.

8. The sliding element according to claim 1, wherein the carbon-based coating comprises oxygen and/or hydrogen each in an amount of less than 0.5 at %.

9. The sliding element according to claim 1, wherein the carbon-based coating has an sp3/sp2 ratio of 0.3 to 1.2.

10. The sliding element according to claim 1, wherein a metal-containing adhesive layer including chromium and/or titanium is provided between the carbon-based coating and a substrate.

11. The sliding element according to claim 10, wherein the adhesive layer has a thickness of 0.05 to 1.0 μm.

12. The sliding element according to claim 1, wherein the proportion of carbon in the carbon-based coating is more than 99% over the entire layer thickness.

13. The sliding element according to claim 1, wherein the sliding element is a piston ring made of cast iron or steel.

14. The sliding element according to claim 1, wherein said sliding element comprises a piston ring.

15. The sliding element according to claim 1, wherein said roughness RΔq is between 0.08 to 0.11.

16. The sliding element according to claim 1, wherein said roughness RΔq is 0.05.

| Rdq | Rz (μm) | Rk (μm) | Rpk (μm) | Ring Wear (μm) | Friction Coefficient μ ( ) | Evaluation ring wear | Evaluation friction coefficient | Total |
|---|---|---|---|---|---|---|---|---|
| 0.02 | 0.2 | 0.06 | 0.02 | 1.0 | 0.049 | OK | not OK | not OK |
| 0.02 | 0.3 | 0.07 | 0.02 | 0.5 | 0.048 | OK | not OK | not OK |
| 0.02 | 0.23 | 0.1 | 0.02 | 1.0 | 0.052 | OK | not OK | not OK |
| 0.02 | 0.18 | 0.07 | 0.02 | 1.5 | 0.044 | OK | not OK | not OK |
| 0.02 | 0.22 | 0.11 | 0.03 | 0.5 | 0.043 | OK | not OK | not OK |
| 0.04 | 0.56 | 0.15 | 0.02 | 0.5 | 0.05 | OK | not OK | not OK |
| 0.06 | 0.45 | 0.18 | 0.08 | 1.0 | 0.024 | OK | OK | OK |
| 0.07 | 0.88 | 0.24 | 0.13 | 2.5 | 0.027 | OK | OK | OK |
| 0.08 | 0.94 | 0.25 | 0.15 | 2.0 | 0.032 | OK | OK | OK |
| 0.08 | 1.07 | 0.18 | 0.19 | 1.0 | 0.027 | OK | OK | OK |
| 0.09 | 1.15 | 0.24 | 0.16 | 1.5 | 0.03 | OK | OK | OK |
| 0.09 | 1.06 | 0.26 | 0.16 | 1.5 | 0.03 | OK | OK | OK |
| 0.1 | 1.11 | 0.31 | 0.18 | 3.0 | 0.033 | OK | OK | OK |
| 0.12 | 1.06 | 0.32 | 0.18 | 11.0 | 0.012 | not OK | OK | not OK |
| 0.14 | 1.1 | 0.43 | 0.17 | 6.5 | 0.015 | not OK | OK | not OK |
| 0.15 | 1.08 | 0.45 | 0.18 | 5.5 | 0.009 | not OK | OK | not OK |

17. The sliding element according to claim 1, wherein the roughness RΔq of 0.05 to 0.1 is formed in axial direction over 25 to 75% of the running surface.

18. The sliding element according to claim 1, wherein the layer thickness of the coating is between 10 to 30 μm.

* * * * *